(12) United States Patent
Han et al.

(10) Patent No.: US 11,205,596 B2
(45) Date of Patent: Dec. 21, 2021

(54) METHOD OF FINFET CONTACT FORMATION

(71) Applicants: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

(72) Inventors: Qiuhua Han, Shanghai (CN); Longjuan Tang, Shanghai (CN)

(73) Assignees: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 43 days.

(21) Appl. No.: 15/814,280

(22) Filed: Nov. 15, 2017

(65) Prior Publication Data
US 2018/0144990 A1    May 24, 2018

(30) Foreign Application Priority Data

Nov. 23, 2016  (CN) .......................... 201611061525.1

(51) Int. Cl.
*H01L 29/417*  (2006.01)
*H01L 21/8238*  (2006.01)
(Continued)

(52) U.S. Cl.
CPC .... *H01L 21/823821* (2013.01); *H01L 21/845* (2013.01); *H01L 29/0607* (2013.01);
(Continued)

(58) Field of Classification Search
CPC ............. H01L 27/0886; H01L 27/0924; H01L 29/41775; H01L 21/76802–76813;
(Continued)

(56) References Cited

U.S. PATENT DOCUMENTS 5,932,491 A * 8/1999 Wald ................. H01L 21/76831
257/752
6,624,024 B1 * 9/2003 Prall ................. H01L 21/76895
257/E21.507
(Continued)

OTHER PUBLICATIONS

European Patent Application No. 17202996.9, Extended European Search Report dated Apr. 19, 2018, 8 pages.

*Primary Examiner* — Bryan R Junge
(74) *Attorney, Agent, or Firm* — Anova Law Group, PLLC

(57) ABSTRACT

A method of manufacturing a semiconductor device includes providing a substrate structure, which includes a substrate, one or more semiconductor fins on the substrate, a gate structure on each fin, an active region located in said fins, and an interlayer dielectric layer covering at the active region. The method includes forming a hard mask layer over the interlayer dielectric layer and the gate structure, and using an etch process with a patterned etch mask, forming a first contact hole extending through the hard mask layer and extending into a portion of the interlayer dielectric layer, using patterned a mask. The method further includes forming a sidewall dielectric layer on sidewalls of the first contact hole, and using an etch process with the sidewall dielectric layer as an etch mask, etching the interlayer dielectric layer
(Continued)

at bottom of the first contact hole to form a second contact hole extending to the active region.

20 Claims, 7 Drawing Sheets

(51) Int. Cl.
    *H01L 21/84*     (2006.01)
    *H01L 29/78*     (2006.01)
    *H01L 29/66*     (2006.01)
    *H01L 29/06*     (2006.01)
    *H01L 29/423*     (2006.01)

(52) U.S. Cl.
    CPC .... *H01L 29/41791* (2013.01); *H01L 29/4238* (2013.01); *H01L 29/66583* (2013.01); *H01L 29/785* (2013.01); *H01L 2029/7858* (2013.01)

(58) Field of Classification Search
    CPC ......... H01L 21/76829; H01L 21/76831; H01L 21/823431; H01L 21/823821; H01L 21/845; H01L 27/10826; H01L 27/10879; H01L 27/1211; H01L 29/41766–41791
    See application file for complete search history.

(56) References Cited

U.S. PATENT DOCUMENTS

| | | | |
|---|---|---|---|
| 9,768,070 B1* | 9/2017 | Lee | H01L 21/823437 |
| 2006/0189137 A1* | 8/2006 | Anderson | H01L 21/31144 |
| | | | 438/691 |
| 2006/0284229 A1* | 12/2006 | Park | H01L 21/76816 |
| | | | 257/304 |
| 2008/0048262 A1* | 2/2008 | Lee | H01L 29/41791 |
| | | | 257/347 |
| 2008/0122110 A1 | 5/2008 | Yang et al. | |
| 2008/0176369 A1* | 7/2008 | Satonaka | H01L 21/0337 |
| | | | 438/231 |
| 2009/0176375 A1* | 7/2009 | Benson | H01L 21/31116 |
| | | | 438/719 |
| 2010/0130010 A1* | 5/2010 | Park | G01B 11/27 |
| | | | 438/689 |
| 2011/0291292 A1* | 12/2011 | Frohberg | H01L 21/76816 |
| | | | 257/774 |
| 2013/0049219 A1* | 2/2013 | Tsai | H01L 21/28518 |
| | | | 257/774 |
| 2014/0061930 A1* | 3/2014 | Holmes | H01L 21/76807 |
| | | | 257/769 |
| 2015/0118836 A1 | 4/2015 | Lin et al. | |
| 2015/0140796 A1 | 5/2015 | Jen et al. | |
| 2016/0141417 A1 | 5/2016 | Park et al. | |
| 2017/0077248 A1* | 3/2017 | Eom | H01L 29/41791 |
| 2017/0200800 A1* | 7/2017 | Liu | H01L 29/66545 |
| 2017/0200821 A1* | 7/2017 | Chang | H01L 21/3085 |

* cited by examiner

METHOD OF FINFET CONTACT FORMATION

CROSS-REFERENCES TO RELATED APPLICATIONS

This application claims priority to Chinese patent application No. 201611061525.1, filed on Nov. 23, 2016, the content of which is incorporated herein by reference in its entirety.

BACKGROUND OF THE INVENTION

The present invention relates to the field of semiconductor technology, and more particularly to a semiconductor device and a method for manufacturing the device.

FinFET (Fin Field-Effect Transistor) is a new complementary metal oxide semiconductor (CMOS) transistor structure, which has many advantages, such as good control of short channel effects, high drive current, low power consumption, and small size, etc. FinFET can offer hope that the Moore's Law device scaling can be extended. Recently, FinFET has begun to be used in the 14-nm node of technology. Currently, in FinFET, the process of forming contacts to active regions often uses a self-aligned process to form the contact hole, and then a conductive material is deposited to fill the contact hole to form a contact member. FIG. 1 illustrates a conventional self-aligned contact formation in a FinFET device. As shown in FIG. 1, an insulating layer 01 is formed on a gate electrode 02, and an insulating layer 03 is formed on a gate electrode 04. The insulating layers 01 and 03 are recessed before a conductive material 05 is used to fill the contact hole. As a result, gate insulating layers 01 and 03 are thinner at the corners. The thinning of the insulators can increase the probability of shorting between the contact member 05 and the gate electrodes 02 and 04. A short between a gate electrode and a contact to an active region can lead to leakage and adversely affect the quality of the semiconductor device.

Accordingly, there is a need for an improved FINFET contact structure method.

BRIEF SUMMARY OF THE INVENTION

Embodiments of the present invention relate to the field of semiconductor technology. More particularly, the embodiments relate to a semiconductor device and a method for manufacturing the device. In an embodiment, a non-self-aligned process is used to generate the upper half portion of a contact hole. A sidewall dielectric layer is formed on the sidewalls of the upper half portion of the contact hole. The lower half of the contact hole is etched using the sidewall dielectric as a self-aligned mask. Leakage between the gate and the contact can be avoided or reduced, and the gate capacitance can be reduced.

According to some embodiments of the invention, a method of manufacturing a semiconductor device includes providing a substrate structure. The substrate structure includes a substrate, one or more semiconductor fins on the substrate, a gate structure on each fin, an active region located in said fins, and an interlayer dielectric layer covering at the active region. The method includes forming a hard mask layer over the interlayer dielectric layer and the gate structure, and using an etch process with a patterned etch mask, forming a first contact hole extending through the hard mask layer and extending into a portion of the interlayer dielectric layer, using patterned a mask. The method further includes forming a sidewall dielectric layer on sidewalls of the first contact hole, and using an etch process with the sidewall dielectric layer as an etch mask, etching the interlayer dielectric layer at bottom of the first contact hole to form a second contact hole extending to the active region.

In an embodiment of the above method, the substrate structure further includes a first insulator and a second insulator, the first insulator being disposed between adjacent fins, the second insulator being formed over the first insulator.

In an embodiment of the above method, the active region has a source electrode and a drain electrode, and a portion of the second insulator extends over the source electrode and drain electrode.

In an embodiment of the above method, a portion of the second insulator extends to sides of the gate structure.

In an embodiment of the above method, the method also includes filling the first contact hole and the second contact hole with a conductive material to form a contact to the active region.

In an embodiment of the above method, forming the first contact hole uses the following etching conditions:
  etch gases including C4F8, C4 F6, oxygen, and carrier gas;
  reaction chamber pressure of 10 mTorr to 100 mTorr;
  at a power of 100 W to 2000 W;
  gas flow rate for C4F8 ranging from 10 sccm to 50 sccm;
  gas flow rate of C4 F6 ranging from 10 sccm to 50 sccm;
  gas flow rate for oxygen ranging from 5 sccm to 30 sccm; and
  gas flow rate of the carrier gas ranging from 50 sccm to 1000 sccm.

In an embodiment of the above method, a depth of the first contact hole is 3-30 nm, and a width of the first contact hole is 30-40 nm.

In an embodiment of the above method, the sidewall dielectric layer includes a low-k dielectric layer with a k value between 1-3.

In an embodiment of the above method, the sidewall dielectric layer includes a low-k silicon nitride layer.

In an embodiment of the above method, the method also includes performing a surface treatment of the sidewall dielectric layer before etching the second contact hole using the following process conditions:
  $CH_3F$ and oxygen;
  reaction chamber pressure of 2 mTorr to 30 mTorr;
  at a power of 100 W-1000 W;
  gas flow rate for $CH_3F$ from of 20 sccm to 200 sccm; and
  gas flow rate of oxygen ranging from 50 sccm to 200 sccm.

In an embodiment of the above method, the gate structure includes a gate dielectric surrounding at least a portion of the fin, a metal gate on the gate dielectric, and a spacer on both sides of the metal gate.

In an embodiment of the above method, cross-sectional dimensions of bottom and top portions of the first contact hole are equal, and cross-sectional dimensions of bottom and top portions of the second contact hole are equal.

According to some embodiments of the invention, a semiconductor device includes a semiconductor substrate, one or more fins on the semiconductor substrate, a gate structure on each fin, a source electrode and a drain electrode on either side of the gate structure, and an interlayer dielectric layer overlying the source electrode and the drain electrode. The device also includes a hard mask layer on the interlayer dielectric layer and the gate structure, and a first contact hole extending through the hard mask layer and extending into a portion of the interlayer dielectric layer. The device also includes a sidewall dielectric layer on sidewalls of the first contact hole extending to a depth of the first contact hole, and a second contact hole extending below the first contact hole and extending to the source electrode or the drain electrode. Moreover, a metal contact member fills in the first contact hole and the second contact hole that extends to the source electrode or the drain electrode.

In an embodiment of the above device, the semiconductor device also includes a first insulator and a second insulator, the first insulator being disposed between adjacent fins, the second insulator being formed over the first insulator.

In an embodiment, a portion of the second insulator extends over the source electrode and drain electrode.

In an embodiment, a portion of the second insulator extends to sides of the gate structure.

In an embodiment, the gate structure is a high-k metal gate structure.

In an embodiment, the depth of the first contact hole is 3-30 nm, a width of the first contact hole is 30-40 nm.

In an embodiment, the sidewall dielectric layer has a thickness of 2-10 nm and a k value of 3-5.

In an embodiment, cross-sectional dimensions of bottom and top portions of the first contact hole are equal, and cross-sectional dimensions of bottom and top portions of the second contact hole are equal.

Other features and advantages of the present invention will become apparent from the following detailed description of exemplary embodiments of the present invention with reference to the accompanying drawings.

BRIEF DESCRIPTION OF THE DRAWINGS

The accompanying drawings, which form a part of the specification, illustrate embodiments of the invention and are used together with the description to explain the principles of the invention.

DETAILED DESCRIPTION OF THE INVENTION

Figure 1:
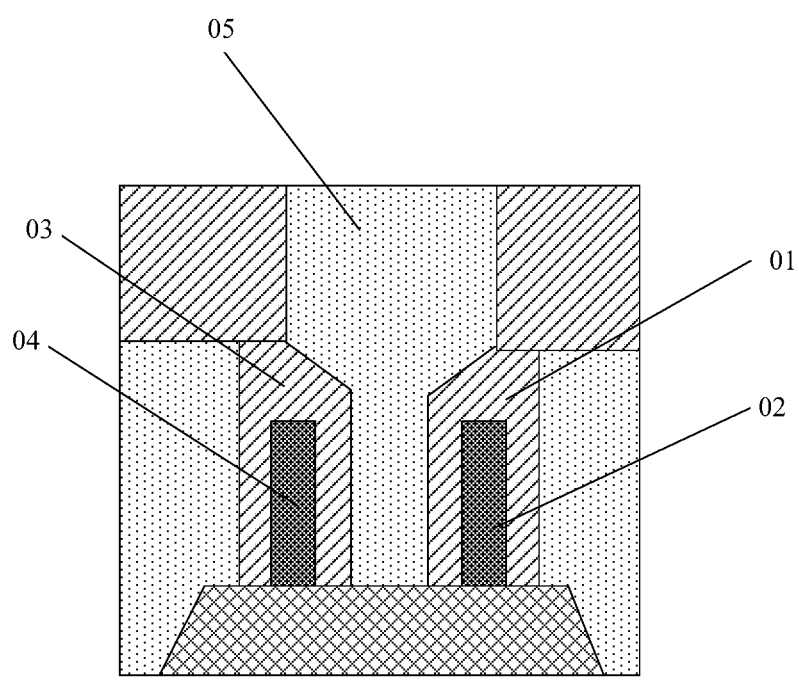
FIG. 1 is a schematic cross-sectional structure of a conventional semiconductor device in which the contact is formed using self-alignment techniques.

Embodiments of the present invention relate to the field of semiconductor technology. More particularly, the embodiments relate to a semiconductor device and a method for manufacturing the device. In an embodiment, a non-self-aligned process to generate the upper half portion of a contact hole. A sidewall dielectric layer is formed on the sidewalls of the upper half portion of the contact hole. The lower half of the contact hole is etched using the sidewall dielectric as a self-aligned mask. Leakage between the gate and the contact can be avoided or reduced, and the gate capacitance can be reduced.

Various exemplary embodiments of the present invention will now be described in detail with reference to the accompanying drawings. It should be noted that the relative arrangement, numerical expression, and numerical values of the components and steps set forth in these embodiments, unless otherwise specified, do not limit the scope of the invention. At the same time, it will be appreciated that the dimensions of the various portions shown in the drawings are not drawn to scale in actuality for ease of description.

The following description of at least one exemplary embodiment is merely illustrative and is in no way intended as a limitation on the invention, its application or use. The techniques, methods, and apparatus known to those of ordinary skill in the relevant art may not be discussed in detail, but the techniques, methods, and apparatuses, as appropriate, should be considered as part of the specification. In all examples shown and discussed herein, any specific value should be construed as merely exemplary and not as limiting. Thus, other examples of exemplary embodiments may have different values. It should be noted that like reference numerals and letters designate like items in the following drawings, and therefore, once an item is defined in a drawing, it is not necessary to further discuss it in the subsequent figures.

Figure 2:
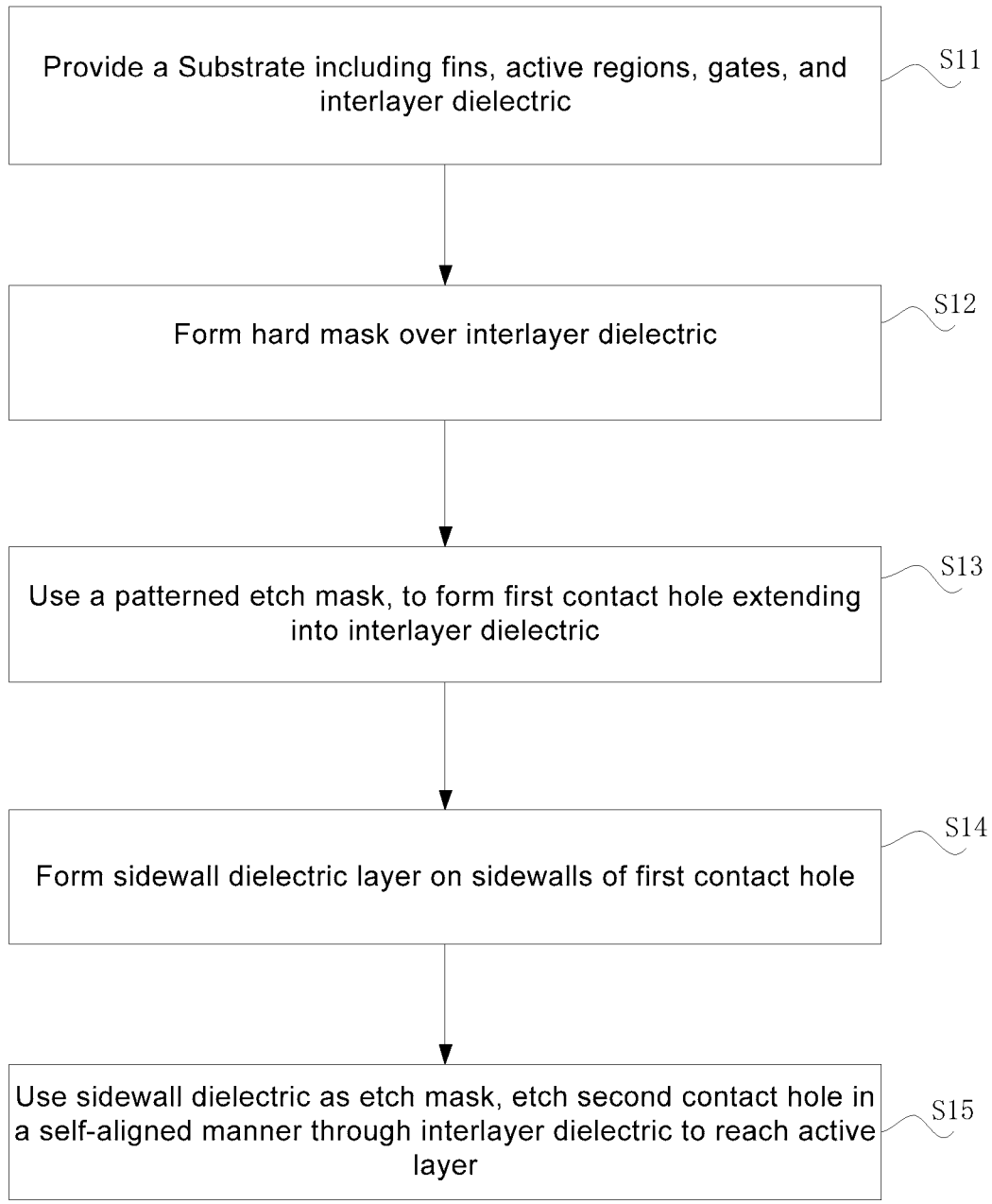
FIG. 2 is a flowchart illustrating a method of manufacturing a semiconductor device according to embodiments of the present invention.

FIG. 2 is a flowchart illustrating a method of manufacturing a semiconductor device according to an embodiment of the present invention some. FIGS. 3 to 7 are schematic cross-sectional schematic views illustrating the structure of some of the several stages of the manufacturing process of a semiconductor device of an embodiment of the present invention.

Figure 3:
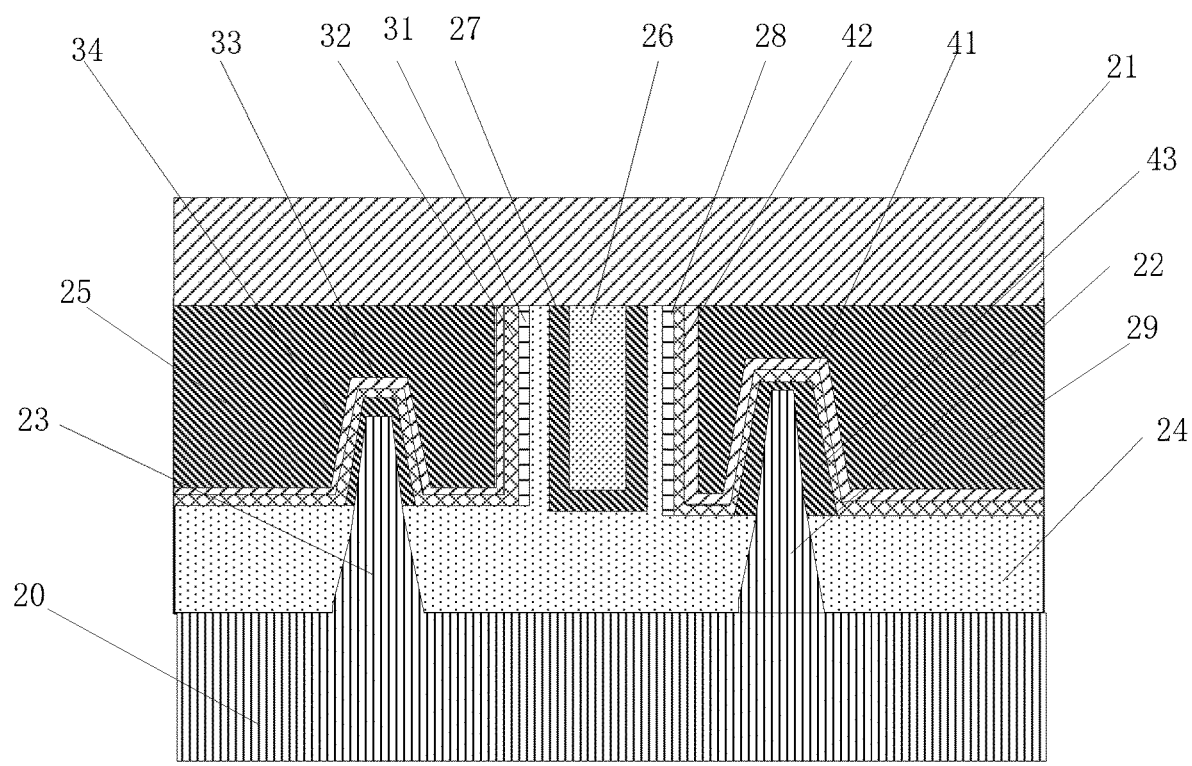
FIG. 3 is a cross-sectional view across the fins illustrating a stage of a manufacturing process of a semiconductor device according to embodiments of the present invention.
Figure 4:
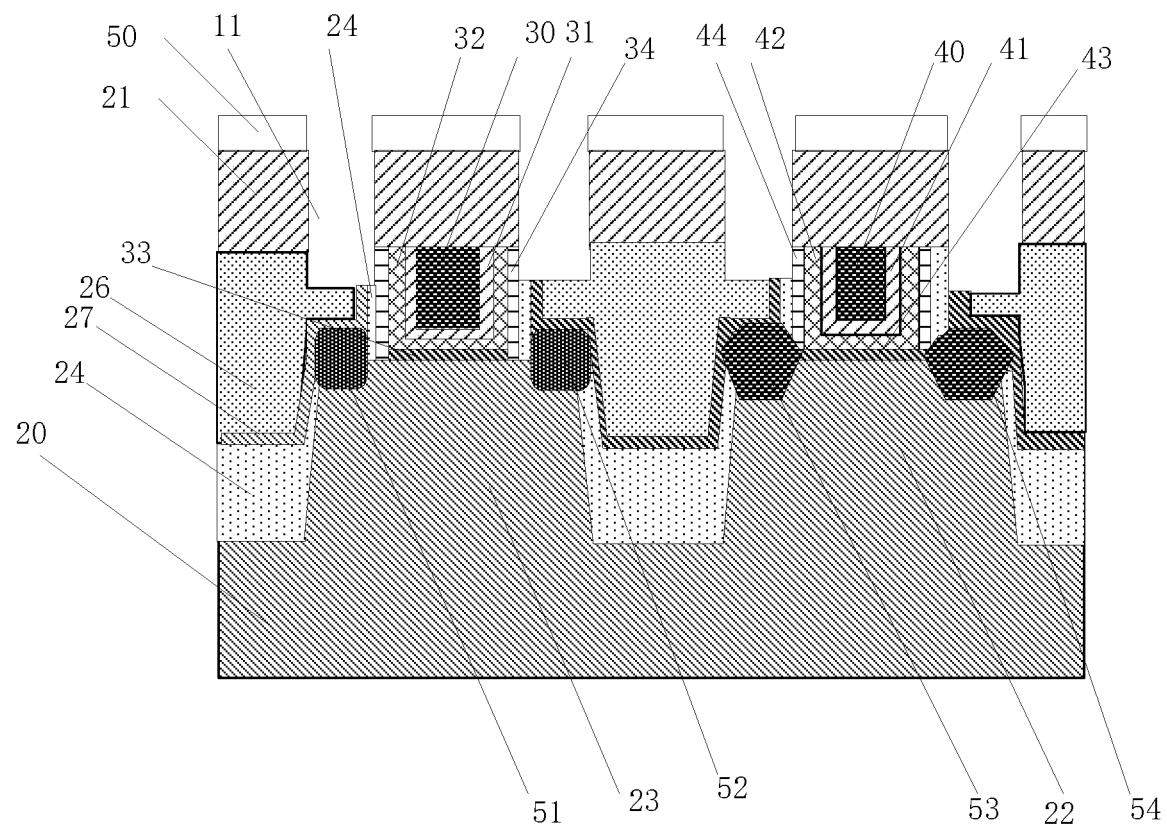
FIG. 4 is a cross-sectional view along the fins illustrating formation of first contact holes in a manufacturing process of a semiconductor device according to embodiments of the present invention.

In step S11, a substrate structure is provided. The substrate structure includes a substrate; one or more semiconductor fins located on the substrate. As shown in FIGS. 3 and 4, the substrate structure includes a substrate (e.g. a silicon substrate) 20, two fins 22 and 23 located on the substrate 20. The fin material may be silicon.

A gate on the fin may have various structures. For example, the gate structure can include a gate dielectric that surrounds at least a portion of the fin, a metal gate electrode on the gate dielectric, and a spacer on both sides of the metal gate. The gate can be manufactured using a variety of processing methods, e.g., using a HKMG (high-k insulating layer-metal gate) manufacturing processes.

In some embodiments, as shown in FIGS. 3 and 4, a gate structure 25 over the fin 23 can include a gate electrode 30, a work function adjustment layer 31, a high-K dielectric layer 32, a gate dielectric 33, and spacers 34. Similarly, a gate structure 29 over the fin 22 can include a gate electrode 40, a work function adjustment layer 41, a high-K dielectric layer 42, a gate insulator 43, and spacers 44.

The device structure can have an active region on at least one side of the gate structure. The semiconductor device may be of NMOS or PMOS type. The active region may include a source electrode 51 and a drain electrode 52, source electrode 53, and drain electrode 54. An interlayer dielectric layer 26 covers source electrode 51, drain electrodes 52, source electrode 53, drain electrode 54. The interlayer dielectric layer 26 may be silicon oxide. In some embodiments, the substrate structure may further include a first insulator 24 and a second insulator 27. In some embodiments, the fins are separated by the first insulator 24. The second insulator 27 is formed over the first insulator 24. In some embodiments, a portion of the second insulator 27 can extend to the sides of the gate structure, as shown in FIG. 3. In some embodiments, a portion of the second insulator 27 can overlie the source and drain electrodes, as shown in FIG. 4.

In step S12, a hard mask layer 21 is formed over the gate structure 26 and the interlayer dielectric layer as shown in FIG. 3. In some embodiments, hard mask layer 21 can be a silicon nitride layer.

In step S13, a patterned mask layer 50 is used as an etch mask to etch a contact hole. The patterned mask can be formed using conventional techniques. For example, a mask material, such as a photoresist or a dielectric layer is formed and then patterned using a photolithographic process. An etch process is carried out to form a first contact hole through the hard mask layer and extending into a portion of the interlayer dielectric layer. This etch process uses a patterned mask layer 50 as an etch mask. Therefore, it is not a self-aligned etch process. As shown in FIG. 4, after the etching, first contact holes 11 are formed extending into portions of interlayer dielectric layer 26 over source electrode 51, drain electrode 52, source electrode 53, and drain electrode 54. The size of the first contact hole may be selected according to different needs. For example, the depth of the first contact hole can be 3-30 nm, and the width of the first contact hole can be 3-40 nm.

In some embodiments, the first contact hole can be etched using different processes according to different requirements. For example, the etch gases can include $C_4F_8$, $C_4F_6$, together with the oxygen and carrier gas in the reaction chamber under a pressure of 10 mTorr to 100 mTorr and at a power of 100 W to 2000 W, e.g., 1000 W. The gas flow rate for $C_4F_8$ can range from 10 sccm to 50 sccm, for example, 20 sccm. The gas flow rate of $C_4F_6$ can range from 10 sccm to 50 sccm, for example, 30 sccm. The gas flow rate for oxygen can range from 5 sccm to 30 sccm, for example, 15 sccm. The flow rate of the carrier gas can range from 50 sccm to 1000 sccm, for example, 500 sccm.

Figure 5:
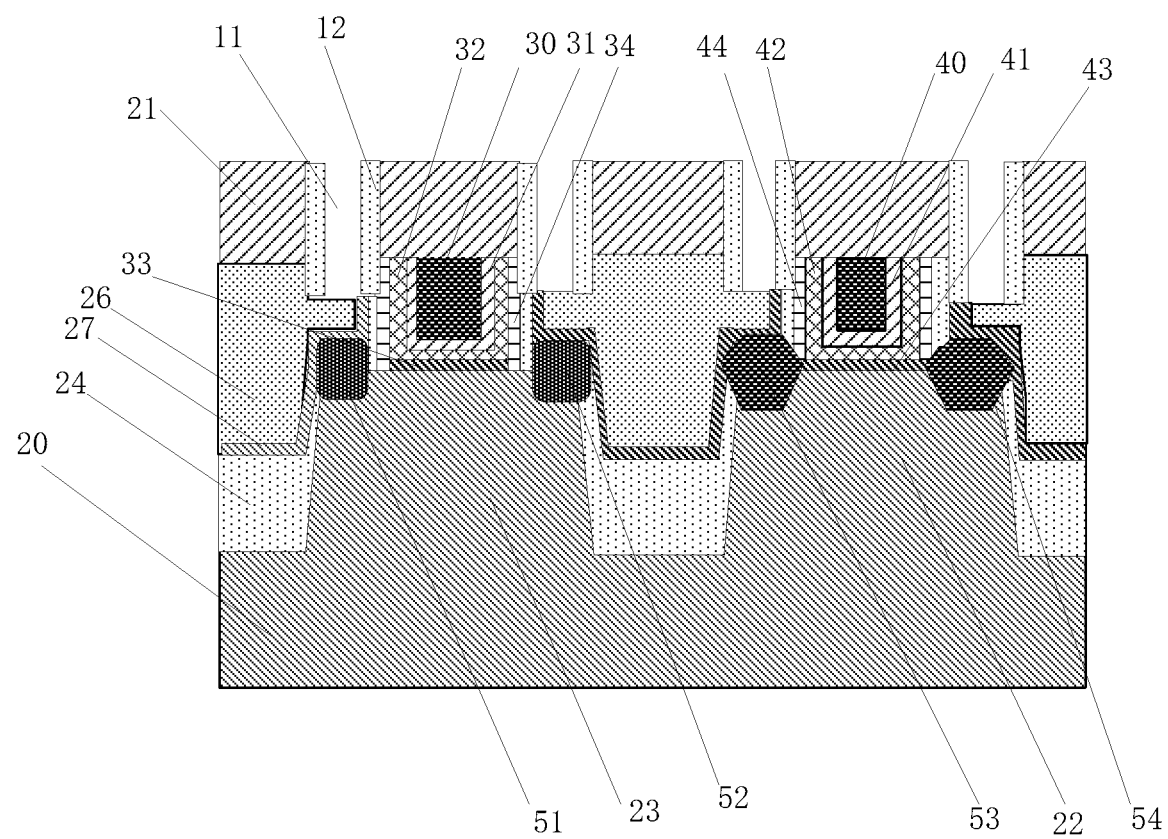
FIG. 5 is a cross-sectional view along the fins illustrating formation of contact hole sidewall dielectric in a manufacturing process of a semiconductor device according to embodiments of the present invention.

In step S14, a sidewall dielectric layer is formed on sidewalls of the first contact hole 11 to partially fill the first contact hole. As shown in FIG. 5, a dielectric layer 12 is formed on the sidewalls of the first contact hole 11. Dielectric layer 12 may be formed using a variety of processes. For example, a deposition process can be used to deposit a low-K silicon nitride layer in the first contact hole 11, and then an anisotropic etching process can be used to form the sidewall dielectric layer, or spacer layer. In an embodiment, the thickness of the silicon nitride layer can be 2-10 nm, for example, 8 nm. The dielectric constant K can be 3-5, for example 4.

In some embodiments, the dielectric layer 12, can be a low K silicon nitride layer. After forming the low K silicon nitride layer and prior to forming second contact hole 13, the low-k silicon nitride layer may be subjected to a surface etching treatment to control the size of the contact hole and the surface finish of the sidewall. Various processes for surface etching may be used. For example, the surface etching treatment may be performed under the following conditions: the $CH_3F$ and oxygen are directed into a reaction chamber under 2 mTorr to 30 mTorr to at a power of 100 W-1000 W, for example, 500 W. The gas flow rate for $CH_3F$ can be from 20 sccm to 200 sccm, e.g., 100 sccm. The gas flow rate of oxygen can range 50 sccm to 200 sccm, for example, 100 sccm.

Figure 6:
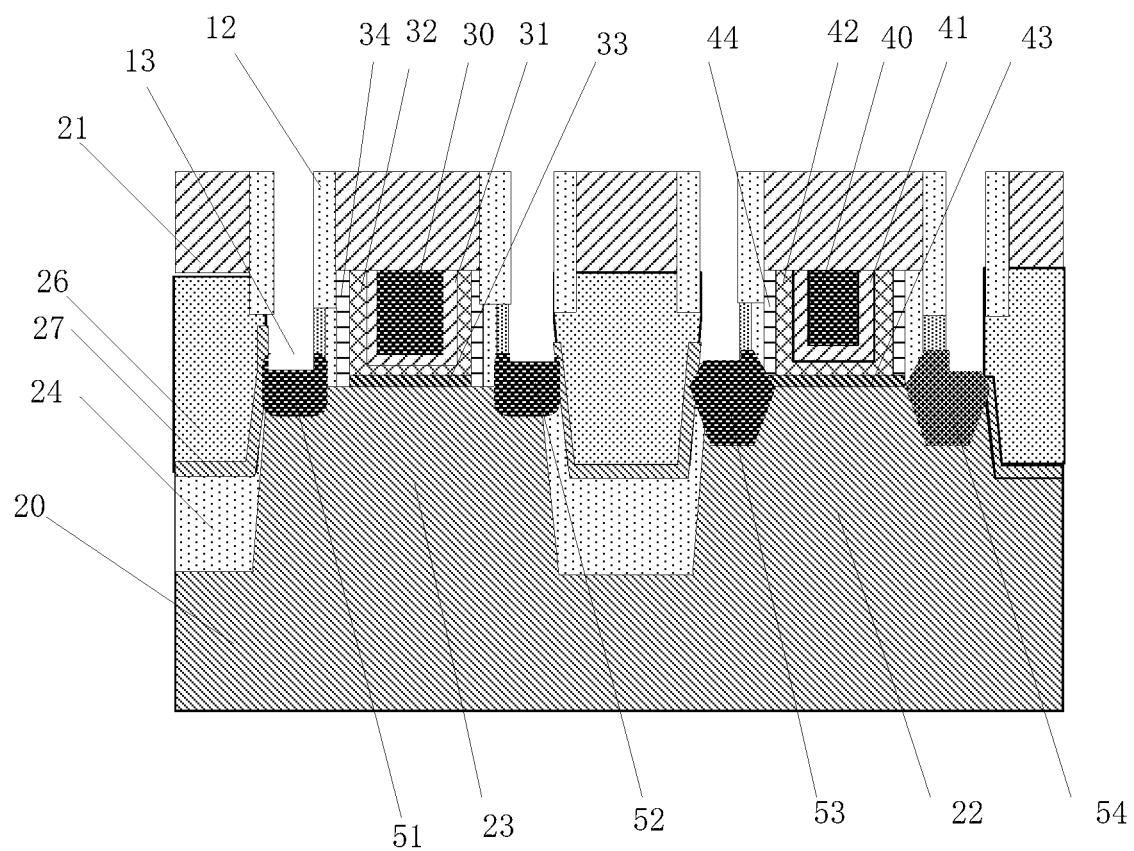
FIG. 6 is a cross-sectional view along the fins illustrating formation of second contact holes in a manufacturing process of a semiconductor device according to embodiments of the present invention.

In step S15, with the sidewall dielectric layer 12 as a mask, a self-aligned etching process is carried out to etch the interlayer dielectric layer at the bottom of the first contact hole 11 to form a second contact hole 13 that extends to the active region. An example is shown in FIG. 6.

The self-aligned etching step for forming the second contact hole 13 can be performed under the following conditions: using $C_4F_8$, $C_4F_6$, together with the oxygen and carrier gas in the reaction chamber under a pressure of 10 mTorr to 100 mTorr and at a power of 100 W to 2000 W, e.g., 500 W. The gas flow rate for $C_4F_8$ can range from 10 sccm to 50 sccm, for example, 30 sccm. The gas flow rate of $C_4F_6$ can range from 10 sccm to 50 sccm, for example, 30 sccm. The gas flow rate for oxygen can range from 5 sccm to 30 sccm, for example, of 20 sccm. The flow rate of the carrier gas can range from 50 sccm to 1000 sccm, for example, 200 sccm.

Figure 7:
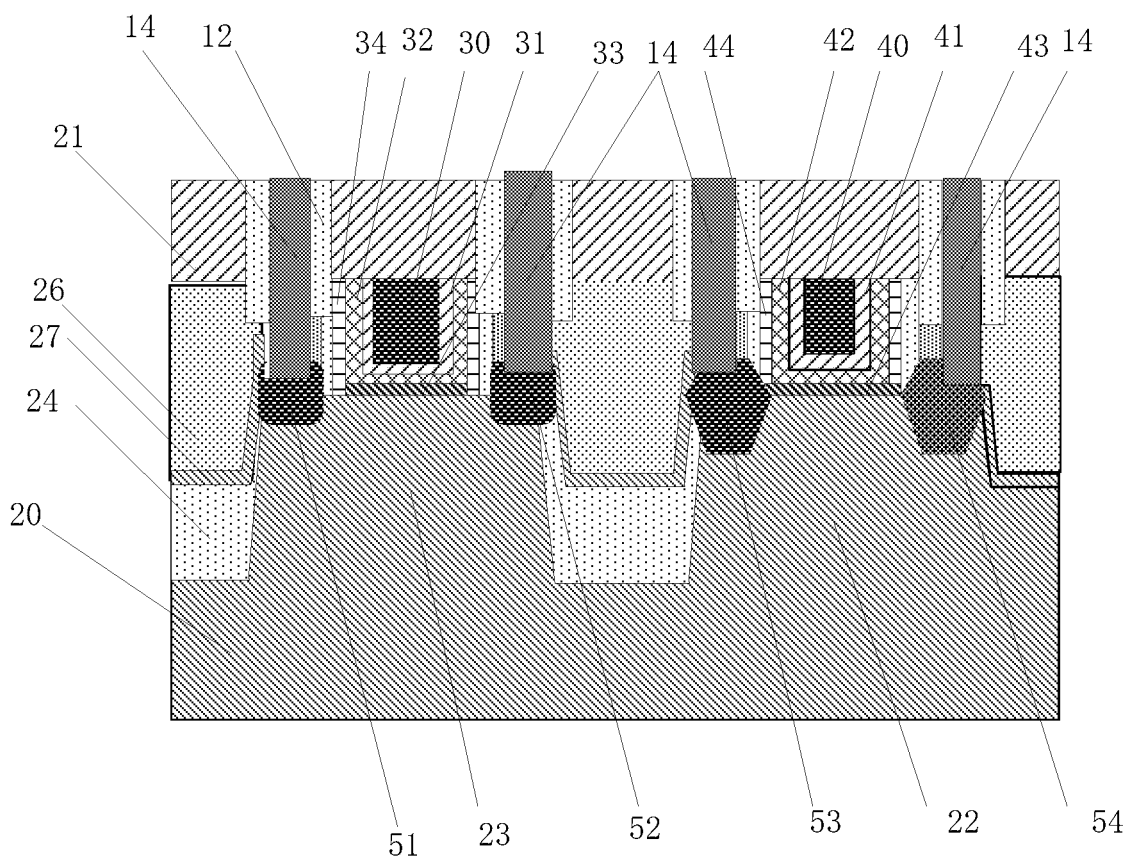
FIG. 7 is a cross-sectional view along the fins illustrating a device structure including formation of contact structures in a manufacturing process of a semiconductor device according to embodiments of the present invention.

In some embodiments, the bottom and top cross-sectional dimensions of the first contact hole are equal. Similarly, the bottom and top cross-sectional dimensions of the second contact hole can also be equal. The cross-sections of the first and second contact holes can be seen in FIG. 6. FIG. 6 also shows that the second contact hole 13 extends to, source 51, drain 52, source 53, and drain 54. As shown in FIG. 7, the first contact hole and the second contact hole are filled with a conductive material to form a contact 14 that contacts the active region, such as source and drain areas.

Accordingly, there is provided a method of manufacturing a semiconductor device according to some embodiments of the present invention. A non-self-aligned process is used to form an upper half portion of the contact hole. Sidewall dielectric layers are formed and then used as a mask in a self-aligned etch process to form a lower portion of the contact hole. As a result, the size of the contact hole is smaller, the contact 14 can be kept farther away from the gate electrode.

Embodiments of the present invention also provide a semiconductor device. As shown in FIG. 7, the semiconductor device may include: a semiconductor substrate 20, one or more fins, e.g., 22 and 23, on the semiconductor substrate, gate structures on the fin structures, source and drain structures on both sides of the gate structures. FIG. 7 shows a source electrode 51, a drain electrode 52, a source electrode 53, and a drain electrode 54. The device structure also has an interlayer dielectric layer 26 covering the source and drain electrode, and first contact holes extending through a hard mask and into interlayer dielectric layer 26 above the source and drain electrodes. The device structure also has low K silicon nitride layers on the sidewalls of the first contact holes, and second contact holes that are below the first contact hole. The second contact holes extend to the source and drain electrodes. Metal contacts 14 are in the first and second contact holes to contact the source and drain electrodes.

In some embodiments, the gate structure is a high-k metal gate structure. The depth of the first contact holes can be 3-30 nm, and the width of the first contact holes can be 30-40 nm. The thickness of the low k silicon nitride layer 12 can be 2-10 nm, and the k value can be 3-5. The cross-sectional dimensions of the bottom and the top of the first contact holes can be equal, and the cross-sectional dimensions of the bottom and the top of the second contact holes are equal.

Thus, in the method and device structure described above, a non-self-aligned process is used to form the upper half portion of contact holes, and a sidewall dielectric layer on the sidewalls of the first contact holes are used as an etch mask to form the lower half of the contact holes. As a result, the dimensions of the contact holes can be made smaller, and the contact is farther away from the gate. This structure can effectively reduce or avoid the leakage between the contact and the gate. Further, the addition of sidewall dielectric layer can making the gate capacitance lower. The performance of the semiconductor device can be improved.

Thus, embodiments of the present invention have been described in detail. To avoid obscuring the concepts, some details known in the art have not been described in detail. Those skilled in the art can fully understand how to implement the technical solution disclosed herein according to the above description. Although a detailed description of specific embodiments of the present invention by way of examples, those skilled in the art will appreciate that the above examples are intended only to be illustrative and not intended to limit the scope of the invention. Further, various embodiments as taught can be freely combined. Those skilled in the art will appreciate that the embodiments described above can have various modifications without departing from the scope and the spirit of the disclosure.

What is claimed is:

1. A method of manufacturing a semiconductor device, comprising:
   providing a substrate structure, the substrate structure including:
      a substrate;
      a plurality of semiconductor fins on the substrate;
      a gate structure on each fin;
      a source electrode and a drain electrode on opposite sides of the gate structure;
      a first insulator disposed between adjacent fins;
      a second insulator on the first insulator and having a portion directly on an upper surface of the source electrode or the drain electrode and on a sidewall portion of the gate structure;
      an interlayer dielectric layer on the second insulator, wherein the gate structure on each fin is separated from an adjacent gate structure on an adjacent fin by the first insulator, the second insulator, and the interlayer dielectric layer, and a portion of the first insulator is on the sidewall portion of the gate structure;
   forming a hard mask layer over the interlayer dielectric layer and the gate structure;
   performing a first etch process using a patterned etch mask as a mask to form a first contact hole extending through the hard mask layer and into a portion of the interlayer dielectric layer by etching the interlayer dielectric layer, the portion of the first insulator on the sidewall portion of the gate structure, and a portion of the second insulator on the sidewall portion of the gate structure;
   forming a sidewall dielectric layer covering sidewalls of the first contact hole, in contact with the hard mask layer and the interlayer dielectric layer, and in contact with the portion of the second insulator on the upper surface of the source electrode or the drain electrode and on a sidewall portion of the gate structure; and
   performing a second etch process using the sidewall dielectric layer as an etch mask to form a second contact hole extending through the interlayer dielectric layer and the second insulator at a bottom of the first contact hole and into the source electrode or the drain electrode, wherein the first etch process is a non-self-aligned etch process and the second etch process is a self-aligned etch process.

2. The method according to claim 1, wherein the portion of the second insulator on the upper surface of the source electrode or the drain electrode extends to sides of the gate structure.

3. The method according to claim 1, further comprising:
   filling the first contact hole and the second contact hole with a conductive material to form a contact to the source electrode or the drain electrode.

4. The method according to claim 1, wherein forming the first contact hole comprises the following etching conditions:
   etch gases including $C_4F_8$, $C_4F_6$, oxygen, and carrier gas;
   reaction chamber pressure of 10 mTorr to 100 mTorr;
   at a power of 100 W to 2000 W;
   gas flow rate for $C_4F_8$ ranging from 10 sccm to 50 sccm;
   gas flow rate of $C_4F_6$ ranging from 10 sccm to 50 sccm;
   gas flow rate for oxygen ranging from 5 sccm to 30 sccm; and
   gas flow rate of the carrier gas ranging from 50 sccm to 1000 sccm.

5. The method according to claim 1, wherein:
   a depth of the first contact hole is 3-30 nm; and
   a width of the first contact hole is 30-40 nm.

6. The method according to claim 1, wherein the sidewall dielectric layer comprises a low-k dielectric layer with a k value between 1-3.

7. The method according to claim 1, wherein the sidewall dielectric layer comprises a low-k silicon nitride layer.

8. The method according to claim 1, further comprising performing a surface treatment of the sidewall dielectric layer before etching the second contact hole, the surface treatment comprises:
   $CH_3F$ and oxygen;
   reaction chamber pressure of 2 mTorr to 30 mTorr;
   at a power of 100 W-1000 W;
   gas flow rate for $CH_3F$ from of 20 sccm to 200 sccm; and
   gas flow rate of oxygen ranging from 50 sccm to 200 sccm.

9. The method according to claim 1, wherein the gate structure comprises:
   a gate dielectric surrounding at least a portion of the fin;
   a metal gate on the gate dielectric; and
   a spacer on both sides of the metal gate.

10. The method according to claim 1, wherein:
    cross-sectional dimensions of bottom and top portions of the first contact hole are equal; and
    cross-sectional dimensions of bottom and top portions of the second contact hole are equal.

11. The semiconductor device according to claim 1, wherein the gate structure comprises:
    a gate insulator layer;
    a high-k dielectric layer on the gate insulator layer;
    a work function adjustment layer on the high-k dielectric layer;
    a gate electrode on the work function adjustment layer; and
    a spacer on sidewalls of the high-k dielectric layer.

12. The semiconductor device according to claim 11, wherein the first insulator layer is directly on the spacer of the gate structure.

13. The semiconductor device according to claim 1, wherein the second etch process reduces a thickness of a remaining portion of the second insulator on the sidewall portion of the gate structure.

14. A semiconductor device comprising:
a semiconductor substrate;
a plurality of fins on the semiconductor substrate;
a gate structure on each fin;
a source electrode and a drain electrode on either side of the gate structure;
a first insulator between adjacent fins;
a second insulator on the first insulator and having a portion directly on an upper surface of the source electrode or the drain electrode and on a sidewall portion of the gate structure;
an interlayer dielectric layer overlying the second insulator, wherein the gate structure on each fin is separated from an adjacent gate structure on an adjacent fin by the first insulator, the second insulator, and the interlayer dielectric layer, and a portion of the first insulator is on the sidewall portion of the gate structure;
a hard mask layer on the interlayer dielectric layer and the gate structure;
a first contact hole extending through the hard mask layer and extending into a portion of the interlayer dielectric layer, wherein the first contact hole exposes the interlayer dielectric layer, the portion of the first insulator on the sidewall portion of the gate structure, and a portion of the second insulator on the sidewall portion of the gate structure;
a sidewall dielectric layer covering sidewalls of the first contact hole, in contact with the hard mask layer and the interlayer dielectric layer, and in contact with the portion of the second insulator on the upper surface of the source electrode or the drain electrode and on a sidewall portion of the gate structure extending to a depth of the first contact hole;
a second contact hole extending below the first contact hole and extending through the second insulator into the source electrode or the drain electrode; and
a metal contact member in the first contact hole and the second contact hole that extends into the source electrode or the drain electrode.

15. The semiconductor device according to claim 14, wherein the portion of the second insulator on the upper surface of the source electrode or the drain electrode extends to sides of the gate structure.

16. The semiconductor device according to claim 14, wherein the gate structure is a high-k metal gate structure.

17. The semiconductor device according to claim 14, wherein the depth of the first contact hole is 3-30 nm, and a width of the first contact hole is 30-40 nm.

18. The semiconductor device according to claim 14, wherein the sidewall dielectric layer has a thickness of 2-10 nm and a k value of 3-5.

19. The semiconductor device according to claim 14, wherein:
cross-sectional dimensions of bottom and top portions of the first contact hole are equal; and
cross-sectional dimensions of bottom and top portions of the second contact hole are equal.

20. The semiconductor device according to claim 14, wherein the gate structure comprises:
a gate insulator layer;
a high-k dielectric layer on the gate insulator layer;
a work function adjustment layer on the high-k dielectric layer;
a gate electrode on the work function adjustment layer; and
a spacer on sidewalls of the high-k dielectric layer.

* * * * *